United States Patent
Choi et al.

(10) Patent No.: US 12,044,742 B2
(45) Date of Patent: Jul. 23, 2024

(54) BATTERY MANAGEMENT SYSTEM, BATTERY PACK, AND BATTERY MANAGEMENT METHOD

(71) Applicant: LG Energy Solution, Ltd., Seoul (KR)

(72) Inventors: Young-Eun Choi, Daejeon (KR); Hyo-Jung Yoon, Daejeon (KR); Hyun-Min Kim, Daejeon (KR); Eun-Ju Lee, Daejeon (KR)

(73) Assignee: LG Energy Solution, Ltd., Seoul (KR)

( * ) Notice: Subject to any disclaimer, the term of this patent is extended or adjusted under 35 U.S.C. 154(b) by 338 days.

(21) Appl. No.: 17/623,664

(22) PCT Filed: Nov. 13, 2020

(86) PCT No.: PCT/KR2020/016034
§ 371 (c)(1),
(2) Date: Dec. 29, 2021

(87) PCT Pub. No.: WO2021/112442
PCT Pub. Date: Jun. 10, 2021

(65) Prior Publication Data
US 2022/0252676 A1    Aug. 11, 2022

(30) Foreign Application Priority Data

Dec. 4, 2019 (KR) .......................... 10-2019-0160103

(51) Int. Cl.
*G01R 31/392* (2019.01)
*H01M 10/42* (2006.01)
*H02J 7/00* (2006.01)

(52) U.S. Cl.
CPC ...... *G01R 31/392* (2019.01); *H01M 10/4285* (2013.01); *H02J 7/0013* (2013.01); *H02J 7/0048* (2020.01); *H02J 7/005* (2020.01)

(58) Field of Classification Search
CPC ............ H01M 10/425; H01M 10/441; H01M 10/482; H01M 10/4285;
(Continued)

(56) References Cited

U.S. PATENT DOCUMENTS 9,496,730 B2 * 11/2016 Gallegos ................. B60L 58/26
9,537,327 B2 * 1/2017 Lai ......................... G01R 31/382
(Continued)

FOREIGN PATENT DOCUMENTS

CN     103358923 A    10/2013
CN     105141003 A    12/2015
(Continued)

OTHER PUBLICATIONS

Extended European Search Report including Written Opinion for Application No. 20895092.3 dated Jul. 27, 2022, pp. 1-7.
(Continued)

*Primary Examiner* — John H Le
(74) *Attorney, Agent, or Firm* — Lerner David LLP (57) ABSTRACT

A battery management system includes a displacement sensor configured to detect a displacement of a cell group including a plurality of battery cells connected in parallel, and a control unit. The control unit is configured to record the displacement of the cell group at a predetermined time interval for a first diagnosis period from a first time point to a second time point during charging of the cell group. The control unit is configured to determine a first displacement curve from a history of the displacement over the first diagnosis period. The control unit is configured to determine whether the plurality of battery cells is nonuniformly degraded based on the first displacement curve.

12 Claims, 7 Drawing Sheets

(58) Field of Classification Search
CPC ........... H01M 2010/4271; H02J 7/0048; H02J 7/005; H02J 7/0013; G01R 31/392; Y02E 60/10
USPC .......................................................... 702/63
See application file for complete search history.

(56) References Cited

U.S. PATENT DOCUMENTS

| | | |
|---|---|---|
| 2006/0276980 A1 | 12/2006 | Mizuno et al. |
| 2013/0249494 A1 | 9/2013 | Ju et al. |
| 2014/0107949 A1 | 4/2014 | Arnold et al. |
| 2015/0066406 A1 | 3/2015 | Sun et al. |
| 2015/0160302 A1 | 6/2015 | Xu et al. |
| 2017/0307693 A1 | 10/2017 | Fukuda et al. |
| 2018/0231616 A1 | 8/2018 | Kabacik |
| 2019/0170829 A1* | 6/2019 | Srinivasan ......... G01R 31/3648 |
| 2019/0195956 A1 | 6/2019 | Lim et al. |
| 2019/0348721 A1 | 11/2019 | Unno |
| 2020/0194753 A1 | 6/2020 | Fujiwara et al. |
| 2021/0197691 A1 | 7/2021 | Stefanopoulou et al. |

FOREIGN PATENT DOCUMENTS

| | | | |
|---|---|---|---|
| EP | 2747239 A1 * | 6/2014 | ............ H02J 7/0014 |
| JP | 4623448 B2 | 2/2011 | |
| JP | 2012234629 A | 11/2012 | |
| JP | 5704539 B2 | 4/2015 | |
| JP | 5733146 B2 | 6/2015 | |
| JP | 2015153696 A * | 8/2015 | |
| JP | 2016100237 A | 5/2016 | |
| JP | 2016126943 A | 7/2016 | |
| JP | 6209173 B2 | 10/2017 | |
| KR | 20110111018 A | 10/2011 | |
| KR | 20130109038 A | 10/2013 | |
| KR | 20140051881 A | 5/2014 | |
| KR | 20180099668 A | 9/2018 | |
| KR | 20190075684 A | 7/2019 | |
| WO | 2017087807 A1 | 5/2017 | |
| WO | 2018010294 A1 | 1/2018 | |
| WO | 2019003772 A1 | 1/2019 | |

OTHER PUBLICATIONS

International Search Report for Application No. PCT/KR2020/016034 mailed Feb. 25, 2021, pp. 1-3.

* cited by examiner

BATTERY MANAGEMENT SYSTEM, BATTERY PACK, AND BATTERY MANAGEMENT METHOD

CROSS-REFERENCE TO RELATED APPLICATIONS

The present application is a national phase entry under 35 U.S.C. § 371 of International Application No. PCT/KR2020/016034 filed Nov. 13, 2020, published in Korean, which claims priority from Korean Patent Application No. 10-2019-0160103, filed Dec. 4, 2019, all of which are incorporated herein by reference.

TECHNICAL FIELD

The present disclosure relates to technology that determines whether the degree of degradation of a plurality of battery cells stacked in a cell group of a battery pack is nonuniform.

BACKGROUND ART

Recently, there has been a rapid increase in the demand for portable electronic products such as laptop computers, video cameras and mobile phones, and with the extensive development of electric vehicles, accumulators for energy storage, robots and satellites, many studies are being made on high performance batteries that can be recharged repeatedly.

Currently, commercially available batteries include nickel-cadmium batteries, nickel-hydrogen batteries, nickel-zinc batteries, lithium batteries and the like, and among them, lithium batteries have little or no memory effect, and thus they are gaining more attention than nickel-based batteries for their advantages that recharging can be done whenever it is convenient, the self-discharge rate is very low and the energy density is high.

An electrode active material of a battery cell such as $Li(NiMnCo)O_2$ increases in volume during charging, and reduces in volume during discharging. Accordingly, the battery cell has thickness changes during the charge and discharge of the battery cell. In particular, it is well known that the volume of the electrode active material significantly changes due to phase transitions that occur when the State Of Charge (SOC) of the battery cell increases or decreases on the basis of a predetermined value.

Further, as the battery cell degrades, there is a larger change in thickness even at the same SOC due to gas generated inside. In this circumstance, attempts have been made to calculate the degree of degradation of the battery cell from a detection value (for example, pressure, displacement) indicating a change in thickness of the battery cell.

In a cell group including a plurality of stacked battery cells, it is important to monitor not only the degree of degradation of each battery cell, but also whether the degree of degradation of the plurality of battery cells is uniform all over the battery cells. However, a plurality of sensors is necessary to individually detect changes in thickness for each battery cell.

SUMMARY

Technical Problem

The present disclosure is designed to solve the above-described problem, and therefore the present disclosure is directed to providing a battery management system, a battery management method, and a battery pack for determining whether a plurality of battery cells stacked in a sequential order has a nonuniform degree of degradation by detecting the displacement of a cell group including the battery cells at a predetermined time interval.

These and other objects and advantages of the present disclosure may be understood by the following description and will be apparent from the embodiments of the present disclosure. In addition, it will be readily understood that the objects and advantages of the present disclosure may be realized by the means set forth in the appended claims and a combination thereof.

Technical Solution

A battery management system according to an aspect of the present disclosure is for a cell group including a plurality of battery cells connected in parallel. The battery management system includes a displacement sensor configured to detect a displacement of the cell group in a stack direction of the plurality of battery cells, and a control unit operably coupled to the displacement sensor. The control unit is configured to detect the displacement of the cell group at a predetermined time interval for a first diagnosis period from a first time point to a second time point during charging of the cell group. The first time point is a time point at which a state of charge of the cell group reaches a first reference value. The second time point is a time point at which the state of charge reaches a second reference value. The control unit is configured to determine a first displacement curve from a history of the displacement of the cell group over the first diagnosis period. The first displacement curve indicates a relationship between the displacement of the cell group and the state of charge for the first diagnosis period. The control unit is configured to determine whether the plurality of battery cells is nonuniformly degraded based on the first displacement curve.

The displacement sensor may include a strain gauge or a laser sensor.

The control unit may be configured to determine a first differential displacement curve from the first displacement curve. The first differential displacement curve indicates a relationship between a differential value of the displacement of the cell group and the state of charge for the first diagnosis period.

The control unit is configured to determine that the plurality of battery cells is nonuniformly degraded in response to a total number of peaks of the first differential displacement curve being equal to or larger than a threshold number.

The control unit may be configured to determine a first differential displacement curve from the first displacement curve, wherein the first differential displacement curve indicates a relationship between a differential value of the displacement of the cell group and the state of charge for the first diagnosis period.

The control unit may be configured to determine that the plurality of battery cells is nonuniformly degraded when a distance between a first peak and a last peak of the first differential displacement curve is equal to or larger than a threshold distance.

The control unit may be configured to detect the displacement of the cell group at the predetermined time interval for a second diagnosis period from a third time point to a fourth time point during discharging of the cell group. The third time point may be a time point at which the state of charge reaches the second reference value. The fourth time point may be a time point at which the state of charge reaches the first reference value.

The control unit may be configured to determine a second displacement curve from a history of the displacement of the cell group over the second diagnosis period. The second displacement curve indicates a relationship between the displacement of the cell group and the state of charge for the second diagnosis period. The control unit may be configured to determine whether the plurality of battery cells is nonuniformly degraded based on the second displacement curve.

The control unit may be configured to determine a second differential displacement curve from the second displacement curve. The second differential displacement curve indicates a relationship between a differential value of the displacement of the cell group and the state of charge for the second diagnosis period.

The control unit may be configured to determine that the plurality of battery cells is nonuniformly degraded in response to a total number of peaks of the second differential displacement curve being equal to or larger than a threshold number.

The control unit may be configured to determine that the plurality of battery cells is nonuniformly degraded in response to a distance between a first peak and a last peak of the second differential displacement curve being equal to or larger than a threshold distance.

The control unit may be configured to stop charging and discharging the cell group in response to the plurality of battery cells being determined to be nonuniformly degraded.

A battery pack according to another aspect of the present disclosure includes the battery management system of any of the embodiments described herein.

A battery management method according to still another aspect of the present disclosure is for a cell group including a plurality of battery cells connected in parallel. The battery management method includes detecting a displacement of the cell group in a stack direction of the plurality of battery cells at a predetermined time interval for a diagnosis period from a first time point to a second time point during charging of the cell group, wherein the first time point is a time point at which a state of charge of the cell group reaches a first reference value, and the second time point is a time point at which the state of charge reaches a second reference value, determining a displacement curve from a history of the displacement of the cell group over the diagnosis period, wherein the displacement curve indicates a relationship between the displacement of the cell group and the state of charge for the diagnosis period, and determining whether the plurality of battery cells is nonuniformly degraded based on the displacement curve.

The battery management method may further include determining a differential displacement curve from the displacement curve. The differential displacement curve indicates a relationship between a differential value of the displacement of the cell group and the state of charge for the diagnosis period.

The battery management method may include determining that the plurality of battery cells is nonuniformly degraded in response to a total number of peaks of the differential displacement curve being equal to or larger than a threshold number.

The battery management method may include determining a differential displacement curve from the displacement curve, wherein the differential displacement curve indicates a relationship between a differential value of the displacement of the cell group and the state of charge for the diagnosis period.

The battery management method may include determining that the plurality of battery cells is nonuniformly degraded in response to a distance between a first peak and a last peak of the differential displacement curve being equal to or larger than a threshold distance.

Advantageous Effects

According to at least one of the embodiments of the present disclosure, it is possible to determine whether a plurality of battery cells stacked in a sequential order has a nonuniform degree of degradation based on a history of displacement detected during charging of a cell group including the battery cells.

In addition, according to at least one of the embodiments of the present disclosure, it is possible to determine whether the plurality of battery cells has a nonuniform degree of degradation based on a history of displacement detected during discharging of the cell group. The effects of the present disclosure are not limited to the effects mentioned above, and these and other effects will be clearly understood by those skilled in the art from the appended claims.

BRIEF DESCRIPTION OF THE DRAWINGS

The accompanying drawings illustrate a preferred embodiment of the present disclosure, and together with the detailed description of the present disclosure described below, serve to provide a further understanding of the technical aspects of the present disclosure, and thus the present disclosure should not be construed as being limited to the drawings.

DETAILED DESCRIPTION

Hereinafter, the preferred embodiments of the present disclosure will be described in detail with reference to the accompanying drawings. Prior to the description, it should be understood that the terms or words used in the specification and the appended claims should not be construed as being limited to general and dictionary meanings, but rather interpreted based on the meanings and concepts corresponding to the technical aspects of the present disclosure on the basis of the principle that the inventor is allowed to define the terms appropriately for the best explanation.

Therefore, the embodiments described herein and illustrations shown in the drawings are just a most preferred embodiment of the present disclosure, but not intended to fully describe the technical aspects of the present disclosure, so it should be understood that a variety of other equivalents and modifications could have been made thereto at the time that the application was filed.

The terms including the ordinal number such as "first", "second" and the like, are used to distinguish one element from another among various elements, but not intended to limit the elements by the terms.

Unless the context clearly indicates otherwise, it will be understood that the term "comprises" when used in this specification, specifies the presence of stated elements, but does not preclude the presence or addition of one or more other elements. Additionally, the term "control unit" as used herein refers to a processing unit of at least one function or operation, and may be implemented by hardware or software alone or in combination.

In addition, throughout the specification, it will be further understood that when an element is referred to as being "connected to" another element, it can be directly connected to the other element or intervening elements may be present.

Figure 1:
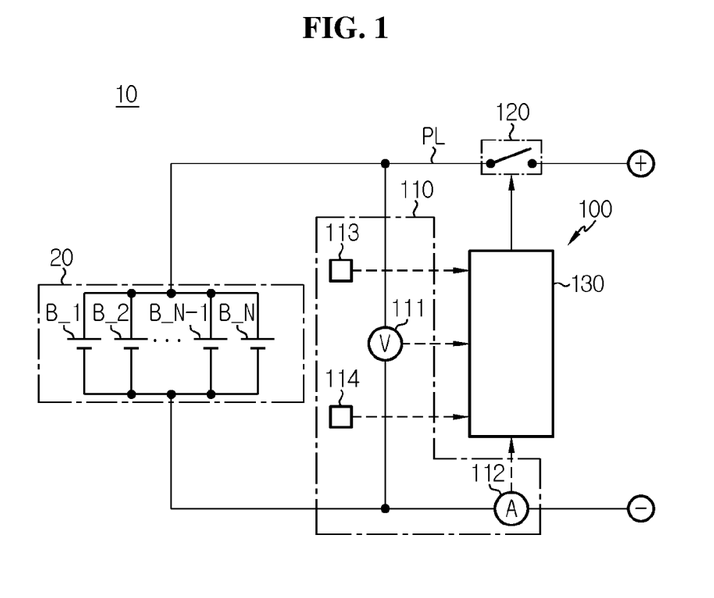
FIG. 1 is a diagram exemplarily showing a configuration of a battery pack according to the present disclosure.
Figure 2:
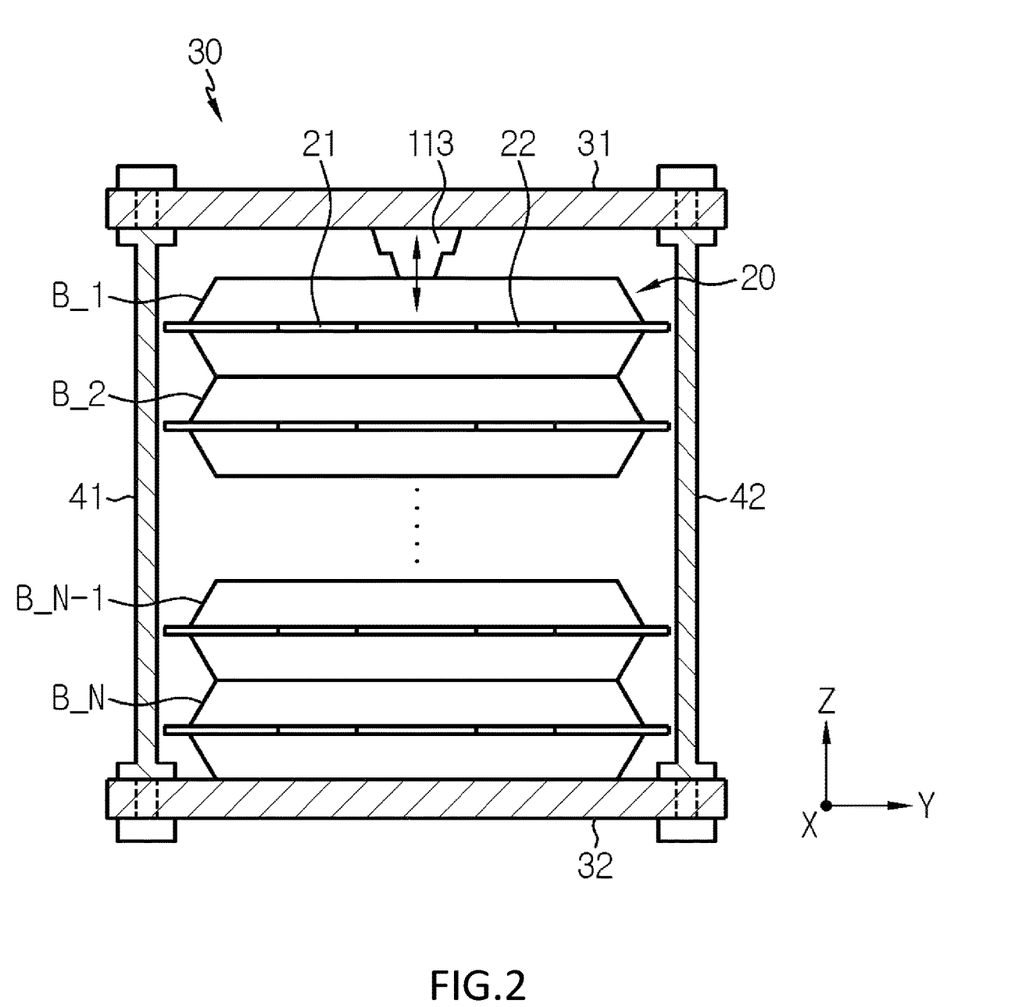
FIG. 2 is a diagram exemplarily showing a connection relationship between a cell group and a pack case of FIG. 1.

FIG. 1 is a diagram exemplarily showing a configuration of a battery pack 10 according to the present disclosure, and FIG. 2 is a diagram exemplarily showing a connection relationship between a cell group 20 and a pack case 30 of FIG. 1.

Referring to FIGS. 1 and 2, the battery pack 10 includes a cell group 20, a pack case 30 and a battery management system 100.

The cell group 20 includes a plurality of battery cells B_1~B_N (N is an integer of 2 or greater) stacked in a sequential order. The plurality of battery cells B_1~B_N may be connected in parallel. Hereinafter, the symbol B is given to the description that is common in the plurality of battery cells B_1~B_N.

The battery cell B has a positive electrode terminal 21 and a negative electrode terminal 22. The battery cell B may include any type of rechargeable battery, for example, a lithium ion battery, and is not limited to a particular type.

In FIG. 2, the X axis indicates the lengthwise direction of the battery cell B, the Y axis indicates the widthwise direction of the battery cell, and the Z axis indicates the thicknesswise direction of the battery cell B. The X axis, Y axis and Z axis may be 3 axes that intersect in the 3-dimensional coordinate system. Hereinafter, assume that the plurality of battery cells B_1~B_N is stacked side by side along the Z axis.

The pack case 30 includes a pair of end plates 31, 32. The cell group 20 may be received in a space in which the pair of end plates 31, 32 are spaced apart from each other along the Z axis. The lower surface of the cell group 20 may be supported by the end plate 32.

The pack case 30 may further include a pair of coupling elements 41, 42. One of two ends of each of the pair of coupling elements 41, 42 may be coupled and fixed to the end plate 31, and the other end may be coupled and fixed to the end plate 32. Accordingly, it is possible to prevent the pair of end plates 31, 32 from moving in the X axis, Y axis and Z axis. The two ends of each of the pair of coupling elements 41, 42 may be coupled through the pair of end plates 31, 32.

The battery management system 100 includes a sensing unit 110, a switch 120 and a control unit 130.

The sensing unit 110 includes a voltage sensor 111, a current sensor 112 and a displacement sensor 113. The sensing unit 110 may further include a temperature sensor 114.

The voltage sensor 111 is connected to a positive electrode terminal and a negative electrode terminal of the cell group 20. The voltage sensor 111 is provided to measure a voltage across the positive electrode terminal and the negative electrode terminal of the cell group 20 (hereinafter referred to as a 'pack voltage').

The current sensor 112 is installed on a power line PL of the battery pack 10. The current sensor 112 is provided to measure a charge/discharge current (hereinafter referred to as a 'pack current') flowing through the power line PL.

The displacement sensor 113 is provided to detect the displacement of the cell group 20 in the stack direction of the plurality of battery cells B_1~B_N within the cell group 20. The displacement may be (i) an increase in stack height of the cell group 20 compared to a predetermined initial height or (ii) an increase in pressure acting in the Z axis direction by the cell group 20 compared to a predetermined initial pressure. The stack height is the sum of thicknesses of the plurality of battery cells B_1~B_N, and may be a straight line distance on the Z axis between a specific point of the upper surface and a specific point of the lower surface of the cell group 20. The upper surface and the lower surface of the cell group 20 may be the outer surfaces of each of two battery cells B_1, B_N positioned at two ends on the Z axis among the plurality of battery cells B_1~B_N.

The displacement sensor 113 is positioned at a location at which the displacement sensor 113 can detect the displacement of the cell group 20. For example, as shown in FIG. 2, the displacement sensor 113 may be positioned in a predetermined area between the end plate 31 of the pack case 30 and the upper surface of the cell group 20.

The displacement sensor 113 detects the displacement of the cell group 20 in the stack direction from a change in distance between the pack case 30 and the cell group 20 caused by expansion or contraction of the plurality of battery cells B_1~B_N during the charge/discharge of the cell group 20. The displacement sensor 113 may be a contact type sensor, such as, for example, a strain gauge. Alternatively, the displacement sensor 113 may be a non-contact type sensor such as, for example, a laser sensor.

The temperature sensor 114 is provided to measure the temperature (hereinafter referred to as 'pack temperature') of the cell group 20.

The switch 120 is installed on the power line PL, and is provided to open/close the path of the charge/discharge current. The switch 120 is controlled to be turned on/off in response to a switching signal from the control unit 130. For example, the switch 120 is turned on when the voltage of the switching signal is high level (for example, 5V), and is turned off when the voltage of the switching signal is low level (for example, 0V). The switch 120 may include a well-known switching device such as a Metal Oxide Semiconductor Field Effect transistor (MOSFET).

The control unit 130 is operably coupled to the sensing unit 110 and the switch 120. The operably coupled refers to connection to enable signal transmission and/or reception. The control unit 130 may be implemented in hardware using at least one of application specific integrated circuits (ASICs), digital signal processors (DSPs), digital signal processing devices (DSPDs), programmable logic devices (PLDs), field programmable gate arrays (FPGAs), microprocessors and electrical units for performing other functions.

The control unit 130 may include a memory inside. The memory may store programs and data necessary to perform a method as described below. The memory may include, for example, at least one type of storage medium of flash memory type, hard disk type, Solid State Disk (SSD) type, Silicon Disk Drive (SDD) type, multimedia card micro type, random access memory (RAM), static random access memory (SRAM), read-only memory (ROM), electrically erasable programmable read-only memory (EEPROM) and programmable read-only memory (PROM).

The control unit 130 periodically collects the pack 10 data indicating information measured by the voltage sensor 111, the current sensor 112, the displacement sensor 113 and/or the temperature sensor 114 at a predetermined time interval. The control unit 130 may update the state of charge of the cell group 20 at the predetermined time interval based on the pack voltage, the pack current and/or the pack temperature during the charge or discharge of the cell group 20. The state of charge is a parameter indicating the current capacity to the maximum capacity in 0-1 or 0-100%. Well-known techniques such as ampere hour, equivalent circuit model and/or Kalman filter may be used to determine the state of charge, and its detailed description is omitted herein.

The control unit 130 determines whether the plurality of battery cells B_1~B_N is nonuniformly degraded using a history in which the displacement detected by the displacement sensor 113 changes over time (hereinafter referred to as a 'displacement history') during the charge and/or discharge of the cell group 20.

Figure 3:
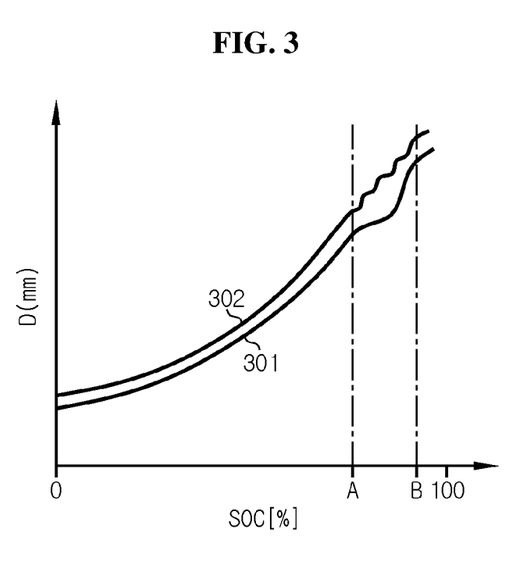
FIG. 3 is a graph exemplarily showing a relationship between the state of charge and differential displacement of a cell group.
Figure 4:
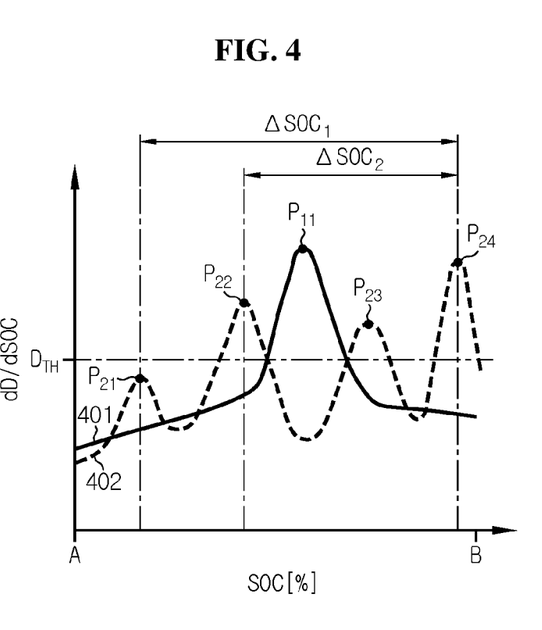
FIG. 4 is a graph exemplarily showing a relationship between the state of charge and differential displacement of a cell group.

FIG. 3 is a graph exemplarily showing a relationship between the state of charge and the displacement of the cell group 20, and FIG. 4 FIG. 4 is a graph exemplarily showing a relationship between the state of charge and the differential displacement of the cell group 20.

In FIG. 3, a displacement curve 301 shows the relationship between the state of charge SOC and the displacement D of the cell group 20 including the plurality of battery cells B_1~B_N degraded uniformly. For example, the displacement curve 301 may be obtained by recording the state of charge SOC and the displacement D at a predetermined time interval while charging the cell group 20 including the plurality of pristine cells with the constant current from the time when the state of charge SOC is 0% until the state of charge SOC is 100%.

A displacement curve 302 shows the relationship between the state of charge SOC and the displacement D of the cell group 20 including the plurality of battery cells B_1~B_N degraded nonuniformly. The nonuniform degradation of the plurality of battery cells B_1~B_N represents that a difference between the maximum degree of degradation and the minimum degree of degradation of the plurality of battery cells B_1~B_N exceeds a predetermined allowable level. For example, the displacement curve 302 may be obtained by mapping and recording the state of charge SOC and the displacement D at a predetermined time interval in the cell group 20 forcibly degraded by repeated charging/discharging for 400 cycles from the time when the state of charge SOC is 0% until the state of charge SOC is 100%.

In FIG. 4, a differential displacement curve 401 is obtained from the displacement curve 301 of FIG. 3, and shows the relationship between the state of charge SOC and the differential displacement dD/dSOC of the cell group 20 in the range from a first reference value A to a second reference value B. dD/dSOC (a differential value of the displacement D) is a ratio of a change dD in D to a change dSOC in SOC at a predetermined time interval. The first reference value A and the second reference value B may be preset from a result of testing to determine the relationship between the degree of degradation of the battery cell and the state of charge at which the phase transition occurs.

A differential displacement curve 402 is obtained from the displacement curve 302 of FIG. 3, and shows the relationship between the state of charge SOC and the differential displacement dD/dSOC of the cell group 20 in the range from the first reference value A to the second reference value B.

When the plurality of battery cells B_1~B_N is uniformly degraded, the phase transition of the plurality of battery cells B_1~B_N simultaneously occurs at same time point or within a very short time range.

On the contrary, when the plurality of battery cells B_1~B_N is nonuniformly degraded, the phase transition of at least two of the plurality of battery cells B_1~B_N occurs over a large time interval. Accordingly, the number of bump regions in the displacement curve 302 is larger than the number of bump regions in the displacement curve 301.

Each bump is exhibited as a peak of the differential displacement curve. Accordingly, the differential displacement curve 402 has a larger number of peaks than the differential displacement curve 401.

First, the differential displacement curve 401 has a single peak $P_{11}$. This indicates that the phase transition in all the plurality of battery cells B_1~B_N uniformly degraded in the cell group 20 occurred at the same time point or within a very short time range.

Subsequently, the differential displacement curve 402 has four peaks $P_{21}$, $P_{12}$, $P_{23}$, $P_{24}$. This indicates that the phase transition of at least four battery cells of the plurality of battery cells B_1~B_N degraded nonuniformly in the cell group 20 occurred at different time points.

During charging, since an increase in state of charge is exhibited as an increase in displacement, each peak of the differential displacement curve 401 and the differential displacement curve 402 is the maximum point. On the contrary, during discharging, since a reduction in state of charge is exhibited as a reduction in displacement, each peak is the minimum point.

Through this, it is possible to determine whether the degree of degradation of the plurality of battery cells B_1~B_N in the cell group 20 is uniform from the number of peaks in the differential displacement curve and/or the distance between peaks.

Figure 5:
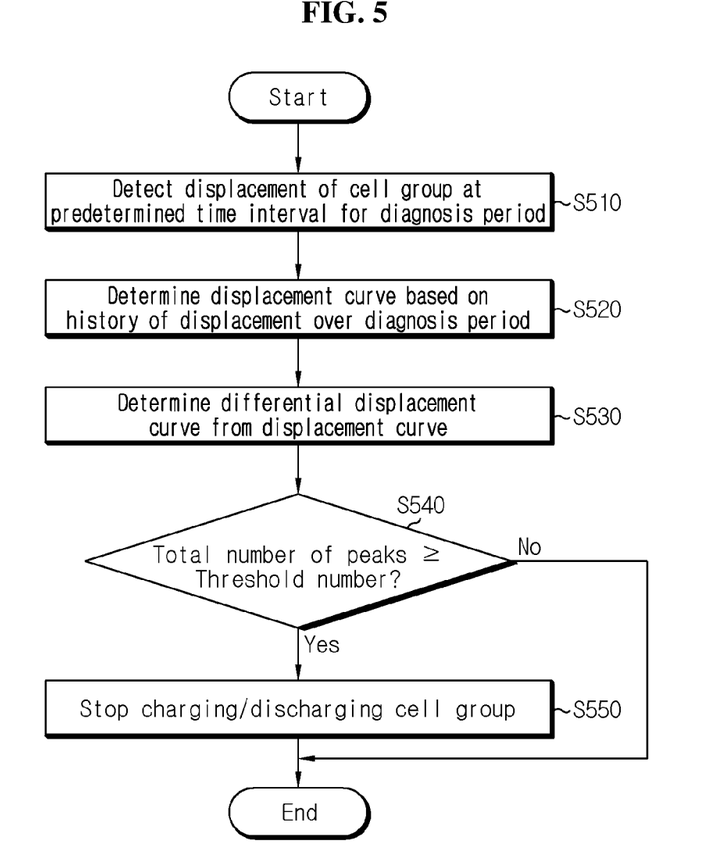
FIG. 5 is a flowchart schematically showing a battery management method according to a first embodiment of the present disclosure.

FIG. 5 is a flowchart schematically showing a battery management method according to a first embodiment of the present disclosure. The method of FIG. 5 may be performed during the charge or discharge of the cell group 20. To help understanding, description is made with reference to the displacement curve 302 of FIG. 3 and the differential displacement curve 402 of FIG. 4.

Referring to FIGS. 1 to 5, in step S510, the control unit 130 detects the displacement of the cell group 20 in the stack direction of the plurality of battery cells B_1~B_N at a predetermined time interval (for example, 0.01 sec) for a diagnosis period.

When the method of FIG. 5 is performed during charging of the cell group 20, the start time of the diagnosis period may be a time point at which the state of charge of the plurality of battery cells B_1~B_N reached the first reference value A, and the ending time of the diagnosis period may be a time point at which the state of charge of the plurality of battery cells B_1~B_N reached the second reference value B (for example, 97%) that is larger than the first reference value A.

When the method of FIG. 5 is performed during discharging of the cell group 20, the start time of the diagnosis period may be a time point at which the state of charge of the plurality of battery cells B_1~B_N reached the second reference value B, and the ending time of the diagnosis period may be a time point at which the state of charge of the plurality of battery cells B_1~B_N reached the first reference value A.

In step S520, the control unit 130 determines the displacement curve 302 based on a history of the displacement detected at the predetermined time interval over the diagnosis period.

In step S530, the control unit 130 determines the differential displacement curve 402 from the displacement curve 302.

In step S540, the control unit 130 determines whether the total number of peaks $P_{21}$, $P_{12}$, $P_{23}$, $P_{24}$ of the differential displacement curve 402 is equal to or larger than a threshold number (for example, 4). The threshold number may be preset to 2 or greater, considering the total number N of the battery cell B included in the cell group 20. A value of the step S540 being "Yes" indicates that the plurality of battery cells B_1~B_N is nonuniformly degraded. When the value of the step S540 is "Yes", the method moves to step S550.

In step S550, the control unit 130 stops charging/discharging the cell group 20. For example, the control unit 130 may turn off the switch 120.

Figure 6:
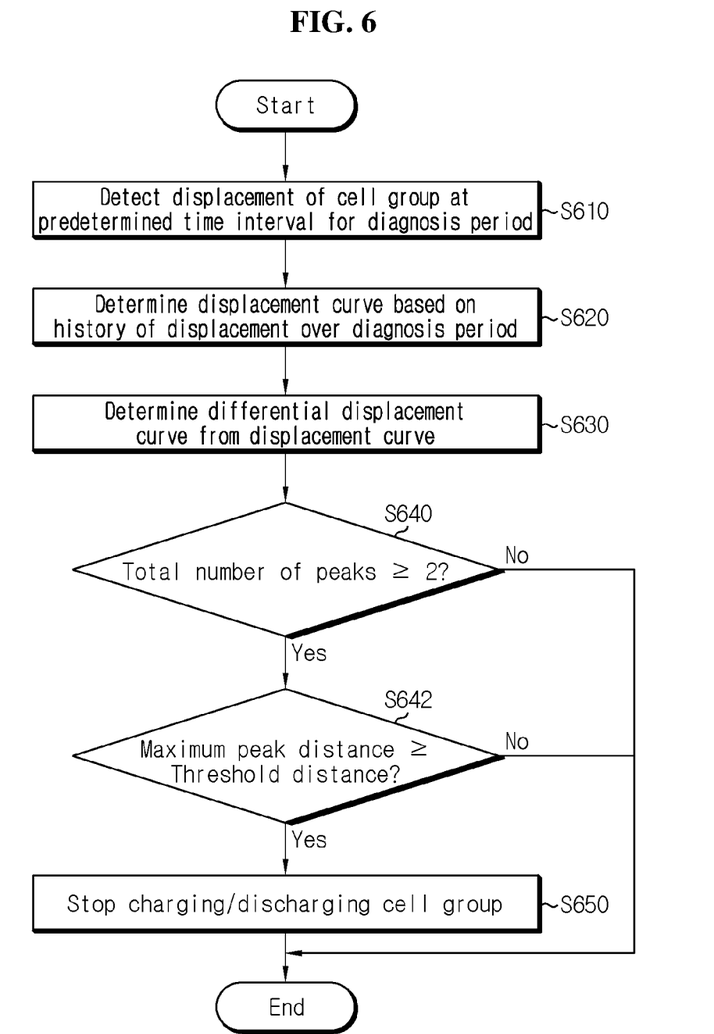
FIG. 6 is a flowchart schematically showing a battery management method according to a second embodiment of the present disclosure.

FIG. 6 is a flowchart schematically showing a battery management method according to a second embodiment of the present disclosure. The method of FIG. 6 may be performed during the charge or discharge of the cell group 20. To help understanding, description is made with reference to the displacement curve 302 of FIG. 3 and the differential displacement curve 402 of FIG. 4.

Referring to FIGS. 1 to 4 and 6, in step S610, the control unit 130 detects the displacement of the cell group 20 in the stack direction of the plurality of battery cells B_1~B_N at a predetermined time interval for the diagnosis period. The description of the step S510 is equally applied to step S610.

In step S620, the control unit 130 determines the displacement curve 302 based on a history of the displacement detected at the predetermined time interval over the diagnosis period.

In step S630, the control unit 130 determines the differential displacement curve 402 from the displacement curve 302.

In step S640, the control unit 130 determines whether the total number of peaks $P_{21}$, $P_{12}$, $P_{23}$, $P_{24}$ of the differential displacement curve 402 is equal to or larger than 2. When a value of the step S640 is "Yes", the method moves to step S642.

In step S642, the control unit 130 determines whether the maximum peak distance of the differential displacement curve 402 is equal to or larger than a threshold distance (for example, 4%). The maximum peak distance is a distance $\Delta SOC_1$ between the first peak $P_{21}$ and the last peak $P_{24}$ appearing in a sequential order on the differential displacement curve 402. In the specification, the distance between two peaks may be an absolute value of difference between the SOC of one peak and the SOC of the other peak. When a value of the step S642 is "Yes", the method moves to step S650.

In step S650, the control unit 130 stops charging/discharging the cell group 20. For example, the control unit 130 may turn off the switch 120.

Figure 7:
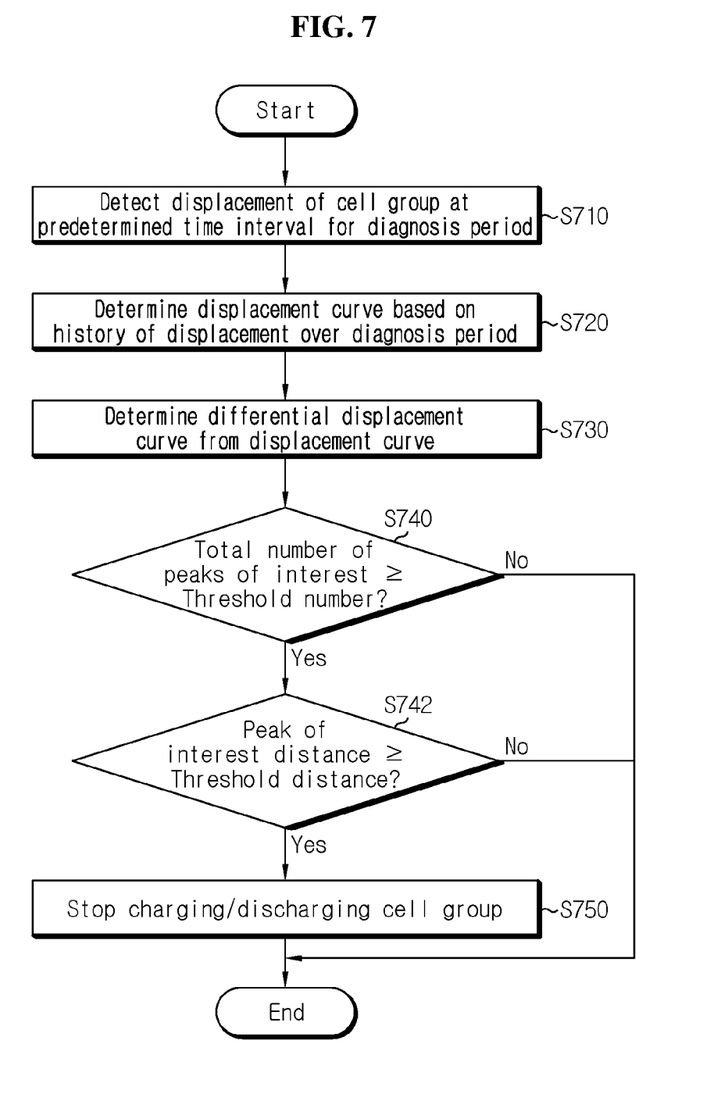
FIG. 7 is a flowchart schematically showing a battery management method according to a third embodiment of the present disclosure.

FIG. 7 is a flowchart schematically showing a battery management method according to a third embodiment of the present disclosure. The method of FIG. 7 may be performed during the charge or discharge of the cell group 20. To help understanding, description is made with reference to the displacement curve 302 of FIG. 3 and the differential displacement curve 402 of FIG. 4.

Referring to FIGS. 1 to 4 and 7, in step S710, the control unit 130 detects the displacement of the cell group 20 in the stack direction of the plurality of battery cells B_1~B_N at a predetermined time interval for the diagnosis period. The description of the step S510 is equally applied to step S710.

In step S720, the control unit 130 determines the displacement curve 302 based on a history of the displacement detected at the predetermined time interval over the diagnosis period.

In step S730, the control unit 130 determines the differential displacement curve 402 from the displacement curve 302.

In step S740, the control unit 130 determines whether the total number of peaks of interest of the differential displacement curve 402 is equal to or larger than the threshold number. The peak of interest is a peak having the differential displacement dD/dSOC that is equal to or larger than a threshold value $D_{TH}$. The threshold value $D_{TH}$ may be preset by experimentally determining a difference in displacement caused by the phase transition of the battery cell B.

In the differential displacement curve 402, the peak $P_{22}$, the peak $P_{23}$ and the peak $P_{24}$ are peaks of interest. The peak $P_{21}$ may appear on the differential displacement curve 402 due to other causes than the phase transition. The threshold number may be preset to 2 or greater considering the total number of battery cells included in the cell group 20. When a value of the step S740 is "Yes", the method moves to step S742.

In step S742, the control unit 130 determines whether a peak of interest distance of the differential displacement curve 402 is equal to or larger than the threshold distance (for example, 4%). The peak of interest distance is a distance $\Delta SOC_2$ between the first peak of interest $P_{22}$ and the last peak of interest $P_{24}$. When a value of the step S742 is "Yes", the method moves to step S750.

In step S750, the control unit 130 stops charging/discharging the cell group 20. For example, the control unit 130 may turn off the switch 120.

As opposed to the first and second embodiments, the third embodiment determines whether the plurality of battery cells B_1~B_N is nonuniformly degraded based on the peaks of interest, not all the peaks, thereby improving the accuracy of determination than the first and second embodiments.

The embodiments of the present disclosure described hereinabove are not implemented only through the apparatus and method, and may be implemented through programs that perform functions corresponding to the configurations of the embodiments of the present disclosure or recording media having the programs recorded thereon, and such implementation may be easily achieved by those skilled in the art from the disclosure of the embodiments previously described.

While the present disclosure has been hereinabove described with regard to a limited number of embodiments and drawings, the present disclosure is not limited thereto and it is obvious to those skilled in the art that various modifications and changes may be made thereto within the technical aspects of the present disclosure and the equivalent scope of the appended claims.

Additionally, as many substitutions, modifications and changes may be made to the present disclosure described hereinabove by those skilled in the art without departing from the technical aspects of the present disclosure, the present disclosure is not limited by the above-described embodiments and the accompanying drawings, and some or all of the embodiments may be selectively combined to allow various modifications.

What is claimed is:

1. A battery management system for a cell group including a plurality of battery cells, the battery management system comprising:
   a displacement sensor configured to detect a displacement of the cell group in a stack direction of the plurality of battery cells; and
   a control unit operably coupled to the displacement sensor,
   wherein the control unit is configured to:
   repeatedly detect the displacement of the cell group at predetermined time intervals for a first diagnosis period from a first time point to a second time point during charging of the cell group, wherein the first time point is a time point at which a state of charge of the cell group reaches a first reference value, and the second time point is a time point at which the state of charge reaches a second reference value,
   determine a first displacement curve from the repeated detections of displacement of the cell group over the first diagnosis period, wherein the first displacement curve indicates a relationship between the displacement of the cell group and the state of charge for the first diagnosis period,
   compare a property of the first displacement curve to a threshold value, and
   determine whether the plurality of battery cells is non-uniformly degraded based on the comparison of the property of the first displacement curve to the threshold value.

2. The battery management system according to claim 1, wherein the displacement sensor includes a strain gauge or a laser sensor.

3. The battery management system according to claim 1, wherein the control unit is configured to:
   determine a first differential displacement curve from the first displacement curve, wherein the first differential displacement curve indicates a relationship between a differential value of the displacement of the cell group and the state of charge for the first diagnosis period, and
   determine that the plurality of battery cells is nonuniformly degraded in response to a total number of peaks of the first differential displacement curve being equal to or larger than a threshold number.

4. The battery management system according to claim 1, wherein the control unit is configured to:
   determine a first differential displacement curve from the first displacement curve, wherein the first differential displacement curve indicates a relationship between a differential value of the displacement of the cell group and the state of charge for the first diagnosis period, and
   determine that the plurality of battery cells is nonuniformly degraded in response to a distance between a first peak and a last peak of the first differential displacement curve being equal to or larger than a threshold distance.

5. The battery management system according to claim 1, wherein the control unit is configured to:
   detect the displacement of the cell group at the predetermined time interval for a second diagnosis period from a third time point to a fourth time point during discharging of the cell group, wherein the third time point is a time point at which the state of charge reaches the second reference value, and the fourth time point is a time point at which the state of charge reaches the first reference value,
   determine a second displacement curve from a history of the displacement of the cell group over the second diagnosis period, wherein the second displacement curve indicates a relationship between the displacement of the cell group and the state of charge for the second diagnosis period, and
   determine whether the plurality of battery cells is non-uniformly degraded based on the second displacement curve.

6. The battery management system according to claim 5, wherein the control unit is configured to:
   determine a second differential displacement curve from the second displacement curve, wherein the second differential displacement curve indicates a relationship between a differential value of the displacement of the cell group and the state of charge for the second diagnosis period, and
   determine that the plurality of battery cells is nonuniformly degraded in response to a total number of peaks of the second differential displacement curve being equal to or larger than a threshold number.

7. The battery management system according to claim 5, wherein the control unit is configured to:
   determine a second differential displacement curve from the second displacement curve, wherein the second differential displacement curve indicates a differential value of the displacement and the state of charge for the second diagnosis period, and
   determine that the plurality of battery cells is nonuniformly degraded in response to a distance between a first peak and a last peak of the second differential displacement curve being equal to or larger than a threshold distance.

8. The battery management system according to claim 1, wherein the control unit is configured to stop charging and discharging the cell group in response to the plurality of battery cells being determined to be nonuniformly degraded.

9. A battery pack comprising the battery management system according to claim 1.

10. A battery management method for a cell group including a plurality of battery cells, the battery management method comprising:
    repeatedly detecting a displacement of the cell group in a stack direction of the plurality of battery cells at a predetermined time interval for a diagnosis period from a first time point to a second time point during charging of the cell group, wherein the first time point is a time point at which a state of charge of the cell group reaches a first reference value, and the second time point is a time point at which the state of charge reaches a second reference value;
    determining a displacement curve from the repeated detections of displacement of the cell group over the diagnosis period, wherein the displacement curve shows a relationship between the displacement of the cell group and the state of charge for the diagnosis period; and
    comparing a property of the first displacement curve to a threshold value;

determining whether the plurality of battery cells is non-uniformly degraded based on the comparison of the property of the first displacement curve to the threshold value.

11. The battery management method according to claim 10, further comprising:

determining a differential displacement curve from the displacement curve, wherein the differential displacement curve indicates a relationship between a differential value of the displacement of the cell group and the state of charge for the diagnosis period, and determining that the plurality of battery cells is nonuniformly degraded in response to a total number of peaks of the differential displacement curve being equal to or larger than a threshold number.

12. The battery management method according to claim 10, further comprising:

determining a differential displacement curve from the displacement curve, wherein the differential displacement curve indicates a relationship between a differential value of the displacement of the cell group and the state of charge for the diagnosis period, and determining that the plurality of battery cells is nonuniformly degraded in response to a distance between a first peak and a last peak of the differential displacement curve being equal to or larger than a threshold distance.

* * * * *